US012165832B2

(12) United States Patent
Stokes et al.

(10) Patent No.: US 12,165,832 B2
(45) Date of Patent: Dec. 10, 2024

(54) SYSTEMS AND METHODS FOR PERFORMING SAMPLE LIFT-OUT FOR HIGHLY REACTIVE MATERIALS

(71) Applicant: FEI Company, Hillsboro, OR (US)

(72) Inventors: Adam Stokes, Hillsboro, OR (US);
Cliff Bugge, Hillsboro, OR (US);
Brandon Van Leer, Hiilsboro, OR (US); Valerie Brogden, Eugene, OR (US); Chengge Jiao, Hillsboro, OR (US); Letian Li, Hillsboro, OR (US);
David Donnet, Hillsboro, OR (US)

(73) Assignee: FEI Company, Hillsboro, OR (US)

( * ) Notice: Subject to any disclaimer, the term of this patent is extended or adjusted under 35 U.S.C. 154(b) by 340 days.

(21) Appl. No.: 17/566,894

(22) Filed: Dec. 31, 2021

(65) Prior Publication Data
US 2023/0215683 A1     Jul. 6, 2023

(51) Int. Cl.
*H01J 37/20* (2006.01)
*H01J 37/244* (2006.01)
*H01J 37/28* (2006.01)

(52) U.S. Cl.
CPC ............ *H01J 37/20* (2013.01); *H01J 37/244* (2013.01); *H01J 37/28* (2013.01);
(Continued)

(58) Field of Classification Search
CPC ............ H01J 37/00; H01J 37/02; H01J 37/20; H01J 37/244; H01J 37/26; H01J 37/28;
(Continued)

(56) References Cited

U.S. PATENT DOCUMENTS 8,729,469 B1 *  5/2014  Schmidt .............. H01J 37/3023
                                                  250/311
9,837,246 B1   12/2017  Geurts et al.
(Continued)

FOREIGN PATENT DOCUMENTS

EP      3613543 A1    2/2020
EP      3637453 A1    4/2020
(Continued)

OTHER PUBLICATIONS

Parmenter et al., Cryo-FIB-Lift-Out: Practically Impossible to Practical Reality, Journal of Microscopy [online], Jan. 22, 2021, 281(2), 157/174. (Year: 2021).*
(Continued)

*Primary Examiner* — Jason L McCormack
(74) *Attorney, Agent, or Firm* — Kilpatrick Townsend & Stockton LLP

(57) ABSTRACT

Methods and systems for performing sample lift-out and protective cap placement for highly reactive materials within charged particle microscopy systems are disclosed herein. Methods include preparing a nesting void in a support structure, translating at least a portion of a sample into the nesting void, and milling material from a region of the support structure that defines the nesting void. The material from the region of the support structure is milled such that at least some of the removed material redeposits to form an attachment bond between the sample and a remaining portion of the support structure. In various embodiments, the sample can then be investigated using one or more of serial sectioning tomography on the sample, enhanced insertable backscatter detector (CBS) analysis on the sample, and electron backscatter diffraction (EBSD) analysis on the sample.

20 Claims, 7 Drawing Sheets

(52) U.S. Cl.
CPC ............... *H01J 2237/2007* (2013.01); *H01J 2237/24475* (2013.01); *H01J 2237/31749* (2013.01)

(58) Field of Classification Search
CPC ..... H01J 2237/2007; H01J 2237/24475; H01J 2237/31749; H01J 2237/208; H01J 2237/31745; G01N 1/28; G01N 1/286; G01N 1/32; G01N 23/20008; G01N 23/046; G01N 23/20058; G01N 23/203; G01N 2001/2866
USPC ................................ 250/306, 307, 310, 311
See application file for complete search history.

(56) References Cited

U.S. PATENT DOCUMENTS

| | | | |
|---|---|---|---|
| 2003/0198755 A1 | 10/2003 | Shichi et al. | |
| 2007/0278421 A1 | 12/2007 | Gleason | |
| 2015/0206706 A1 | 7/2015 | Man | |
| 2019/0139735 A1* | 5/2019 | Alvis | H01J 37/31 |
| 2021/0350998 A1* | 11/2021 | Shukla | H01J 37/26 |

FOREIGN PATENT DOCUMENTS

| | | | | |
|---|---|---|---|---|
| JP | 2010197272 A | | 9/2010 | |
| WO | WO-2015155301 A1 | * | 10/2015 | ....... G01N 23/20025 |

OTHER PUBLICATIONS

Application No. EP22217135.7, Extended European Search Report, Mailed On Apr. 26, 2023, 9 pages.
EP22217135.7, "Third Party Observations", Aug. 31, 2023, 3 pages.
Kuba et al., "Advanced Cryo-Tomography Workflow Developments—Correlative Microscopy, Milling Automation and Cryo-Lift-Out", Journal of Microscopy, vol. 281, No. 2, Feb. 2021, pp. 112-124.
Parmenter et al., "Cryo-FIB-Lift-Out: Practically Impossible to Practical Reality", Journal of Microscopy, vol. 281, No. 2, Feb. 2021, pp. 157-174.
Schreiber et al., "A Method for Site-Specific and Cryogenic Specimen Fabrication of Liquid/Solid Interfaces for Atom Probe Tomography", Ultramicroscopy, vol. 194, Nov. 2018, pp. 89-99.
EP22217135.7, "Intention to Grant", Mar. 18, 2024, 9 pages.
EP Application No. 24188812.2, "Extended European Search Report", Oct. 15, 2024, 10 pages.
Schreiber, D.K., D.E. Perea, J.V. Ryan, J.E. Evans, J.D. Vienna. A method for site-specific and cryogenic specimen fabrication of liquid/solid interfaces for atom probe tomography. Ultramicroscopy [online]. Jul. 25, 2018, 194, 89-99. ISSN 03043991. Available from: doi:10.1016/j.ultramic.2018.07.010.†
Parmenter, Christopher David, Zubair Ahmed Nizamudeen. Cryo-FIB-lift-out: practically impossible to practical reality. Journal of Microscopy [online]. Jan. 22, 2021, 281(2), 157-174. ISSN 0022-2720. Available from: doi:10.1111/jmi.12953.†

* cited by examiner
† cited by third party

SYSTEMS AND METHODS FOR PERFORMING SAMPLE LIFT-OUT FOR HIGHLY REACTIVE MATERIALS

BACKGROUND OF THE INVENTION

In scanning and transmission charged particle microscopy, a charged particle beam is used to image or otherwise investigate a region of interest on a sample. In many cases, before a region of interest can be imaged and/or investigated, it is often necessary to prepare and/or manipulate a sample within the system to allow the region of interest to be exposed or otherwise prepared. In current systems, such preparations often include one or more ways of preparing a sample from a larger specimen using a charged particle beam, attaching the sample to a manipulation probe to allow the sample to be translated within the microscopy system, and attaching the sample to a sample holder such that a region of interest on the sample can be processed, imaged, and/or otherwise investigated.

In current systems, the sample is attached to the probe and/or the sample holder using a precursor gas or deposited liquid. Specifically, in some attachment methods a precursor gas is introduced to a volume around the sample, where the gas molecules form deposits on the sample, probe, and/or sample holder when irradiated by a charged particle beam. In another current attachment method, a liquid is first introduced to a sample, probe, and/or sample holder, and the liquid is irradiated with a charged particle beam such that it is cured, forming an attachment bond between the sample and the probe, and/or sample holder. However, while these systems work for many general applications, they each suffer from drawbacks that make them unsuitable for some microscopy investigations.

For example, charged particle microscopy systems investigate samples in sealed chambers to reduce contamination of the optical components, reduce the effects of undesired particulates on the charged particle beam, and have unwanted deposits on the sample. The introduction of a precursor gas and/or liquid adds additional materials to the charged particle microscopy systems' chamber, increasing these undesired effects. Additionally, introducing gas or liquid requires specifically tailored mechanisms that complicate the design and implementation of new charged particle systems, while also adding complex processing steps that are difficult for new users to implement accurately. Finally, for highly reactive samples, traditional precursor gases cannot be used as the introduction of the gases may cause degradation of the sample surface and/or cause the sample to be more reactive to a charged particle beam when subsequent post-attachment milling or imaging is performed. Because of this, there is a desire to have new attachment and sample manipulation systems and processes to allow for the imaging and investigation of highly reactive materials.

SUMMARY OF THE INVENTION

Methods and systems for performing sample lift-out and protective cap placement for highly reactive materials within charged particle microscopy systems are disclosed herein. Methods include preparing a nesting void in a support structure, translating at least a portion of a sample into the nesting void, and milling material from a region of the support structure that defines the nesting void. The material from the region of the support structure is milled such that at least some of the removed material redeposits to form an attachment bond between the sample and a remaining portion of the support structure. In various embodiments, the sample can then be investigated using one or more of serial sectioning tomography on the sample, enhanced insertable backscatter detector (CBS) analysis on the sample, and electron backscatter diffraction (EBSD) analysis on the sample.

Systems for performing sample lift-out and protective cap placement for highly reactive materials within a charged particle system according to the present disclosure, may comprise a charged particle emitter configured to emit charged particles towards a sample, a sample holder configured to support the sample, an optical column configured to direct the charged particles to be incident on the sample, and a detector system configured to detect emissions from the sample due to irradiation by the charged particles. The systems further include one or more processors, and a memory storing non-transitory computer readable instructions, that when executed by the one or more processors, cause the microscope system to prepare a nesting void in a support structure, translate at least a portion of a sample into the nesting void, and mill material from a region of the support structure that defines the nesting void.

BRIEF DESCRIPTION OF THE DRAWINGS

The detailed description is described with reference to the accompanying figures. In the figures, the left-most digit(s) of a reference number identify the figure in which the reference number first appears. The same reference numbers in different figures indicates similar or identical items.

Like reference numerals refer to corresponding parts throughout the several views of the drawings.

DETAILED DESCRIPTION OF EMBODIMENTS

Figure 1:
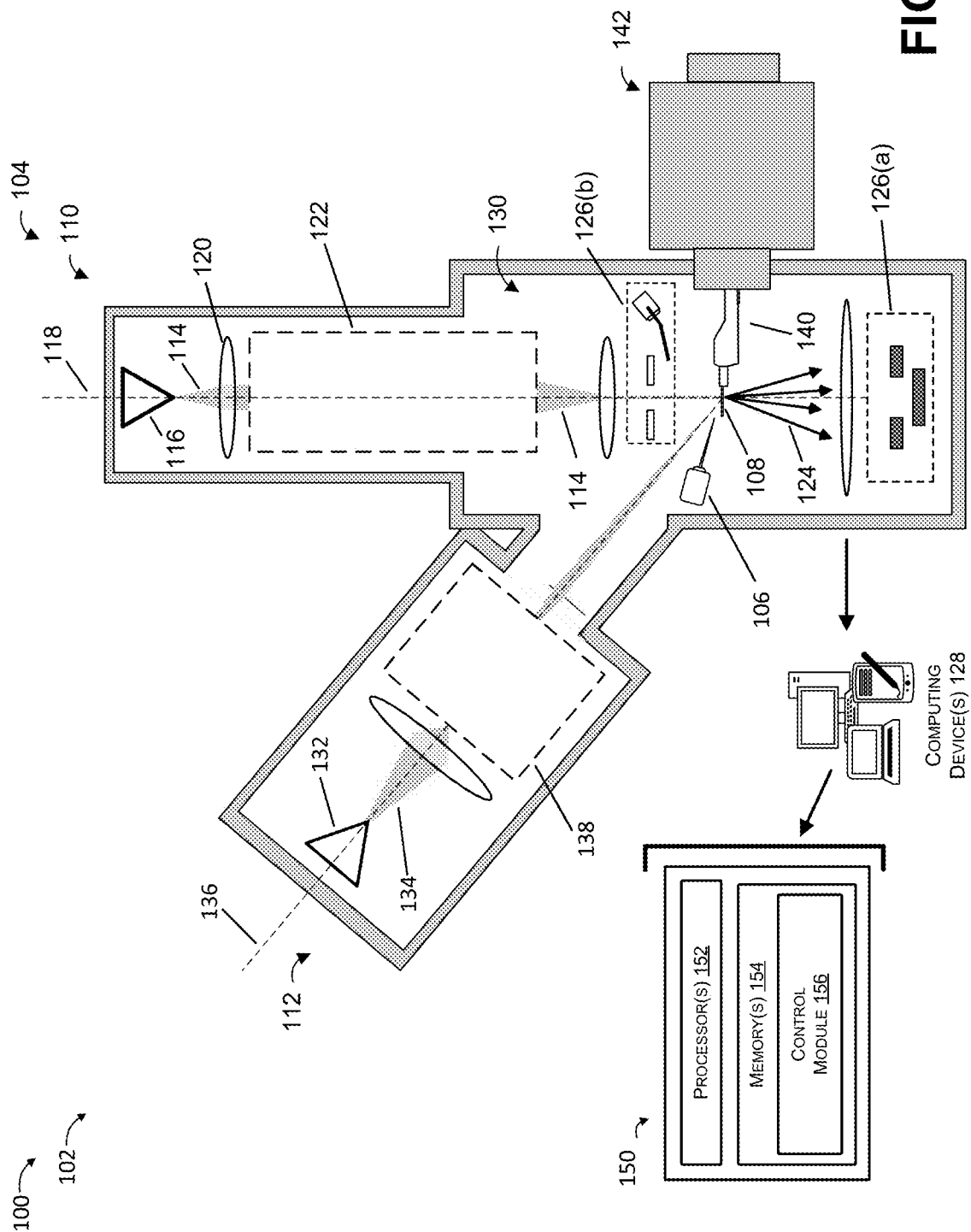
FIG. 1 illustrates example systems for performing sample lift-out and protective cap placement for highly reactive materials, and/or for creating attachments between a sample manipulator and a sample within charged particle microscopy systems.

Methods and systems for performing sample lift-out and protective cap placement for highly reactive materials within charged particle microscopy systems are disclosed. More specifically, the disclosure includes methods and systems in which a nesting void is created in a support structure, a sample is translated such that at least a portion of the sample is located within the nesting void, and then material from a region of the support structure that defines the nesting void is milled away. The material from the region of the support structure is located proximate to the sample such that at least some of the removed material redeposits to form one or more attachment bonds between the sample and the remaining portions of the support structure. In this way, the sample can be attached to the sample holder without requiring a precursor gas or other type of attaching medium to be added to the charged particle system. Additionally, because the attachment is formed by the passive redeposition of milled material, there is much less opportunity for reactions and/or other types of damage to the sample. This allows for samples composed of highly reactive materials, such as those found in lithium-based battery technology, to be attached to a sample holder without damaging the sample. Once the sample is attached to the sample holder in this way, one or more regions of interest of the sample can be imaged and/or investigated using one or more methodologies, such as but not limited to, serial sectioning tomography on the sample, enhanced insertable backscatter detector (CBS) analysis on the sample, and electron backscatter diffraction (EBSD) analysis on the sample.

Additionally, methods and systems for creating attachments between a sample manipulator and a sample within a charged particle system are also disclosed herein. Specifically, the disclosure includes methods and systems in which a sample is attached to a holder or manipulator via irradiation of a high sputter yield material proximate to the sample. Initially, a sample manipulator is translated such that a portion of the manipulator that is made of a high sputter yield material is located proximate to the sample (e.g., within a micron). Then, a region of the high sputter yield material proximate to the sample is milled away using a charged particle beam such that at least some of the removed high sputter yield material redeposits to form an attachment between the sample manipulator and the sample. According to the present disclosure, a high sputter yield material corresponds to a material that yields a greater number of atoms per ion when irradiated with a specific ion beam species and voltage than silicon or tungsten. For example, a high sputter yield material is a high sputter yield material defined as a material that emits greater than 5, 7, 8, or 10 atoms per ion when the material is irradiated with a 30 kV Ga+ focused ion beam, such as copper or zinc.

Generally, in the figures, elements that are likely to be included in a given example are illustrated in solid lines, while elements that are optional to a given example are illustrated in broken lines. However, elements that are illustrated in solid lines are not essential to all examples of the present disclosure, and an element shown in solid lines may be omitted from a particular example without departing from the scope of the present disclosure.

FIG. 1 illustrates example systems 100 for performing sample lift-out and protective cap placement for highly reactive materials, and/or for creating attachments between a sample manipulator and a sample within charged particle microscopy systems. Specifically, FIG. 1 shows an example environment 102 that includes an example microscope system(s) 104 for creating attachments between a sample manipulator 106 and a sample 108 and/or performing sample lift-out and protective cap placement for highly reactive materials in situ. It is noted that present disclosure is not limited to environments that include microscopes, and that in some embodiments the environments 100 may include a different type of system that is configured to manipulate and/or otherwise examine samples 108.

The example microscope system(s) 104 may be or include one or more different types of optical, and/or charged particle microscopes, such as, but not limited to, a scanning electron microscope (SEM), a scanning transmission electron microscope (STEM), a transmission electron microscope (TEM), a charged particle microscope (CPM), a cryo-compatible microscope, focused ion beam (FIB) microscope, dual beam microscopy system, or combinations thereof. FIG. 1 shows the example microscope system(s) 104 as being a dual beam microscopy system including a STEM column 110 and a FIB column 112.

FIG. 1 depicts the example microscope system(s) 104 as including STEM column 110 for irradiating the sample 108 with a charged particle beam 114. The STEM column 110 includes an electron source 116 (e.g., a thermal electron source, Schottky-emission source, field emission source, etc.) that emits an electron beam 114 along an electron emission axis 118 and towards the sample 108. The electron emission axis 118 is a central axis that runs along the length of the example microscope system(s) 104 from the electron source 116 and through the sample 108. While FIG. 1 depicts the example microscope system(s) 104 as including an electron source 116, in other embodiments the STEM column 110 may comprise a charged particle source, such as an ion source, configured to emit a plurality of charged particles toward the sample 108.

An accelerator lens 120 accelerates/decelerates, focuses, and/or directs the electron beam 114 towards an electron focusing column 122. The electron focusing column 122 focuses the electron beam 114 so that it is incident on at least a portion of the sample 108. Additionally, the focusing column 122 may correct and/or tune aberrations (e.g., geometric aberrations, chromatic aberrations) of the electron beam 114. In some embodiments, the electron focusing column 122 may include one or more of an aperture, deflectors, transfer lenses, scan coils, condenser lenses, objective lens, etc. that together focus electrons from electron source 116 onto a small spot on the sample 108. Different locations of the sample 108 may be scanned by adjusting the electron beam direction via the deflectors and/or scan coils. In this way, the electron beam 114 may act as an imaging beam that is scanned across a surface layer of the sample (i.e., the surface of the layer proximate the STEM column 104 and/or that is irradiated by the electron beam 114). This irradiation of the surface layer of the sample 108 causes the component electrons of the electron beam 114 to interact with component elements/molecules/features of the sample, such that component elements/molecules/features cause emissions 124 to be emitted by the sample 108. The specific emissions that are released are based on the corresponding elements/molecules/features that caused them to be emitted, such that the emissions can be analyzed to determine information about the corresponding elements/molecules. Additionally, while FIG. 1 illustrates the emissions 124 as traveling downstream of the sample 108, a person having skill in the art would understand that emissions may be released in other directions, including but not limited to towards the charged particle source 116.

FIG. 1 further illustrates detector systems 126(a) and 126(b) for detecting emissions 124 resultant from the electron beam 114 being incident on the sample 108. The detector system 126 may comprise one or more detectors positioned or otherwise configured to detect such emissions. For example, a charged particle system according to the present invention may include a detector system 126(a)

positioned below the sample 108, a detector system 126(b) positioned above the sample 108, or both. In various embodiments, different detectors and/or different portions of single detectors may be configured to detect different types of emissions, or be configured such that different parameters of the emissions detected by the different detectors and/or different portions. The detector system 126 is further configured to generate a data/data signal corresponding to the detected emissions, and transmit the data/data signal to one or more computing devices 128.

While FIG. 1 also depicts the example microscope system(s) 104 as including FIB column 112 for removing portions of the sample 108 or other object in the microscope chamber 130. For example, the FIB column 112 may be used to mill away portions of a specimen body to reveal or otherwise create the sample 108. In other embodiments the example microscope system(s) 104 may include other types of delayering components, such as a laser, a mechanical blade (e.g., a diamond blade), an electron beam, etc. The FIB column 112 is shown as including a charged particle emitter 132 configured to emit a plurality of ions 134 along an ion emission axis 136.

The ion emission axis 136 is a central axis that runs from the charged particle emitter 132 and through the sample 108. The FIB column 112 further includes an ion focusing column 138 that comprises one or more of an aperture, deflectors, transfer lenses, scan coils, condenser lenses, objective lens, etc. that together focus ions from charged particle emitter 132 onto a small spot on the sample 108. In this way, the elements in the ion focusing column 138 may cause the ions emitted by the charged particle emitter 132 to mill away or otherwise remove one or more portions of the sample 108 or other body. For example, during slice and view imaging the FIB column 112 may be configured to cause a surface layer of the sample 108 having a known thickness to be removed from the sample 108 between image acquisitions.

FIG. 1 further illustrates the example microscope system(s) 104 as further including a sample holder 140, a sample manipulator 106, and a sample loading chamber 142. The sample holder 140 is configured to hold the sample 108, and can translate, rotate, and/or tilt the sample 108 in relation to the example microscope system(s) 104. For example, the sample holder 140 may comprise a grid or structure on which a sample or a specimen is to be attached and/or otherwise held by. Additionally, the sample manipulator 108 is a mechanism in the microscope chamber 130 that is able to interact with the sample 108 such that the sample may be translated, angled, and/or rotated. For example, FIG. 1 shows the sample manipulator as comprising a probe portion that extends from a body, and to which the sample can be attached. The sample loading chamber 142 may be sealable from the microscope chamber 130, and may allow the sample holder 140 to be retracted into it such that a user may be able to access and/or interact with the sample holder 140 while it is in the sample loading chamber 142.

The environment 100 is also shown as including one or more computing device(s) 128. Those skilled in the art will appreciate that the computing devices 128 depicted in FIG. 1 are merely illustrative and are not intended to limit the scope of the present disclosure. The computing system and devices may include any combination of hardware or software that can perform the indicated functions, including computers, network devices, internet appliances, PDAs, wireless phones, controllers, oscilloscopes, amplifiers, etc.

The computing devices 128 may also be connected to other devices that are not illustrated, or instead may operate as a stand-alone system.

It is also noted that one or more of the computing device(s) 128 may be a component of the example microscope system(s) 104, may be a separate device from the example microscope system(s) 104 which is in communication with the example microscope system(s) 104 via a network communication interface, or a combination thereof. For example, an example microscope system(s) 104 may include a first computing device 128 that is a component portion of the example microscope system(s) 104, and which acts as a controller that drives the operation of the example charged particle microscope system(s) 104 (e.g., adjust the scanning location on the sample by operating the scan coils, etc.). In such an embodiment the example microscope system(s) 104 may also include a second computing device 128 that is a desktop computer separate from the example microscope system(s) 104, and which is executable to process data received from the detector system 126 to generate images of the sample 108 and/or perform other types of analysis or post-processing of detector data. The computing devices 128 may further be configured to receive user selections via a keyboard, mouse, touchpad, touchscreen, etc. The computing device(s) 128 are configured to generate images of the surface layer of the sample 108 within the example microscope system(s) 104 based on data and/or the data signal from the detector system 126.

Additionally, the computing device(s) 128 are configured to control the FIB column 112, the sample manipulator 106, and/or sample holder 140 to allow for the performance of sample lift-out and protective cap placement for highly reactive materials within charged particle microscopy systems 104. For example, the computing devices 128 may cause the FIB column 112 to mill a nesting void in a support structure (e.g., a sample grid, a sample holder, or other structure which allows the sample to be imaged/investigated when the sample is attached to it) using the plurality of ions 134. One or more user selections, an automation program, or a combination thereof may allow the computing devices 128 to cause a sample holder 140 or sample manipulation device 106 to be translated (e.g., translated, angled, and/or rotated) such that at least a portion of the sample 108 is positioned within the nesting void. Once the sample 108 is positioned at least partially within the nesting void, the computing device 128 may cause the FIB column 112 to mill away portions of the support structure near the part of the sample and/or which define the nesting. User selections, an automation program, or a combination thereof select the portions of the support structure that are to be milled in this way such that the milled material redeposits to form an attachment bond between the support structure and the portion of the sample 108 in the nesting void. In this way, interconnections are formed between the sample 108 and the support structure such that the sample 108 is held in place for further processing/imaging without requiring deposition gases or other material to be added to the microscope chamber 130. In some embodiments, the computing devices 128 may be further configured to cause the example microscope system(s) 104 to prepare the sample 108 prior to attachment (e.g., remove it from a larger specimen body, reveal a surface/structure of interest), process the sample to prepare it for imaging/investigation, or perform an imaging/investigation of one or more regions of the sample 108.

Alternatively, or in addition, the computing devices 128 may be configured to create one or more attachments between the sample manipulator 106 and the sample 108 within charged particle systems 104 without the need for additional deposition gases or other material to be added to the microscope chamber 130. For example, the computing devices 128 may cause a high sputter yield material (e.g., copper) to be positioned proximate to the sample 108. The high sputter yield material may be optionally attached to a sample manipulator, a sample manipulator may itself comprise the high sputter yield material (e.g., purchased with such a coating, or purchased without where the coating was added via deposition in situ or ex situ).

User selections, an automation program, or a combination thereof may then cause the computing devices 128 to activate the FIB column 112 to mill away portions of the high sputter yield material proximate to the sample while leaving one or more other portions of the high sputter yield material located close to the sample manipulator remaining unmilled. In this way, while some portions of the high sputter yield material near the sample are removed, there remain portions of the material that are still within 10 microns, 1 micron, or closer to the sample. Thus, when the milled high sputter yield material redeposits, it forms one or more attachment bonds between the sample and the sample manipulator.

FIG. 1 further includes a schematic diagram illustrating an example computing architecture 150 of the computing devices 128. Example computing architecture 150 illustrates additional details of hardware and software components that can be used to implement the techniques described in the present disclosure. Persons having skill in the art would understand that the computing architecture 150 may be implemented in a single computing device 128 or may be implemented across multiple computing devices. For example, individual modules and/or data constructs depicted in computing architecture 150 may be executed by and/or stored on different computing devices 128. In this way, different process steps of the inventive methods disclosed herein may be executed and/or performed by separate computing devices 128 and in various orders within the scope of the present disclosure. In other words, the functionality provided by the illustrated components may in some implementations be combined in fewer components or distributed in additional components. Similarly, in some implementations, the functionality of some of the illustrated components may not be provided and/or other additional functionality may be available.

In the example computing architecture 150, the computing device includes one or more processors 152 and memory 154 communicatively coupled to the one or more processors 152. While not intended to be limiting, example computing architecture 150 is shown as including a control module 156 stored in the memory 154. As used herein, the term "module" is intended to represent example divisions of executable instructions for purposes of discussion, and is not intended to represent any type of requirement or required method, manner, or organization. Accordingly, while various "modules" are described, their functionality and/or similar functionality could be arranged differently (e.g., combined into a fewer number of modules, broken into a larger number of modules, etc.). Further, while certain functions and modules are described herein as being implemented by software and/or firmware executable on a processor, in other instances, any or all of modules can be implemented in whole or in part by hardware (e.g., a specialized processing unit, etc.) to execute the described functions. As discussed above in various implementations, the modules described herein in association with the example computing architecture 150 can be executed across multiple computing devices 128.

The control module 156 can be executable by the processors 152 to cause a computing device 128 and/or example microscope system(s) 104 to take one or more actions and/or perform functions or maintenance of the systems. In some embodiments, the control module 156 may cause the example microscope system(s) 204 to perform a sample lift-out and/or protective cap placement for highly reactive materials within charged particle microscopy systems 104 For example, the control module 156 may cause the example microscope system(s) 204 to perform such a process using example processes described in the remarks regarding FIGS. 2-4. Alternatively, or in addition the control module 156 may be configured to cause the example microscope system(s) 204 to create one or more attachments between the sample manipulator 106 and the sample 108 within charged particle systems 104 without the need for additional deposition gases or other material to be added to the microscope chamber 130. For example, the control module 156 may cause the example microscope system(s) 204 to perform such a process using example processes described in the remarks regarding FIGS. 5-7.

As discussed above, the computing devices 128 include one or more processors 152 configured to execute instructions, applications, or programs stored in a memory(s) 154 accessible to the one or more processors. In some examples, the one or more processors 152 may include hardware processors that include, without limitation, a hardware central processing unit (CPU), a graphics processing unit (GPU), and so on. While in many instances the techniques are described herein as being performed by the one or more processors 152, in some instances the techniques may be implemented by one or more hardware logic components, such as a field programmable gate array (FPGA), a complex programmable logic device (CPLD), an application specific integrated circuit (ASIC), a system-on-chip (SoC), or a combination thereof.

The memories 154 accessible to the one or more processors 152 are examples of computer-readable media. Computer-readable media may include two types of computer-readable media, namely computer storage media and communication media. Computer storage media may include volatile and non-volatile, removable, and non-removable media implemented in any method or technology for storage of information, such as computer readable instructions, data structures, program modules, or other data. Computer storage media includes, but is not limited to, random access memory (RAM), read-only memory (ROM), erasable programmable read only memory (EEPROM), flash memory or other memory technology, compact disc read-only memory (CD-ROM), digital versatile disk (DVD), or other optical storage, magnetic cassettes, magnetic tape, magnetic disk storage or other magnetic storage devices, or any other non-transmission medium that may be used to store the desired information and which may be accessed by a computing device. In general, computer storage media may include computer executable instructions that, when executed by one or more processing units, cause various functions and/or operations described herein to be performed. In contrast, communication media embodies computer-readable instructions, data structures, program modules, or other data in a modulated data signal, such as a carrier wave, or other transmission mechanism. As defined herein, computer storage media does not include communication media.

Those skilled in the art will also appreciate that items or portions thereof may be transferred between memory 154 and other storage devices for purposes of memory management and data integrity. Alternatively, in other implementations, some or all the software components may execute in memory on another device and communicate with the computing devices 128. Some or all of the system components or data structures may also be stored (e.g., as instructions or structured data) on anon-transitory, computer accessible medium or a portable article to be read by an appropriate drive, various examples of which are described above. In some implementations, instructions stored on a computer-accessible medium separate from the computing devices 128 may be transmitted to the computing devices 128 via transmission media or signals such as electrical, electromagnetic, or digital signals, conveyed via a communication medium such as a wireless link. Various implementations may further include receiving, sending, or storing instructions and/or data implemented in accordance with the foregoing description upon a computer-accessible medium.

Figure 2:
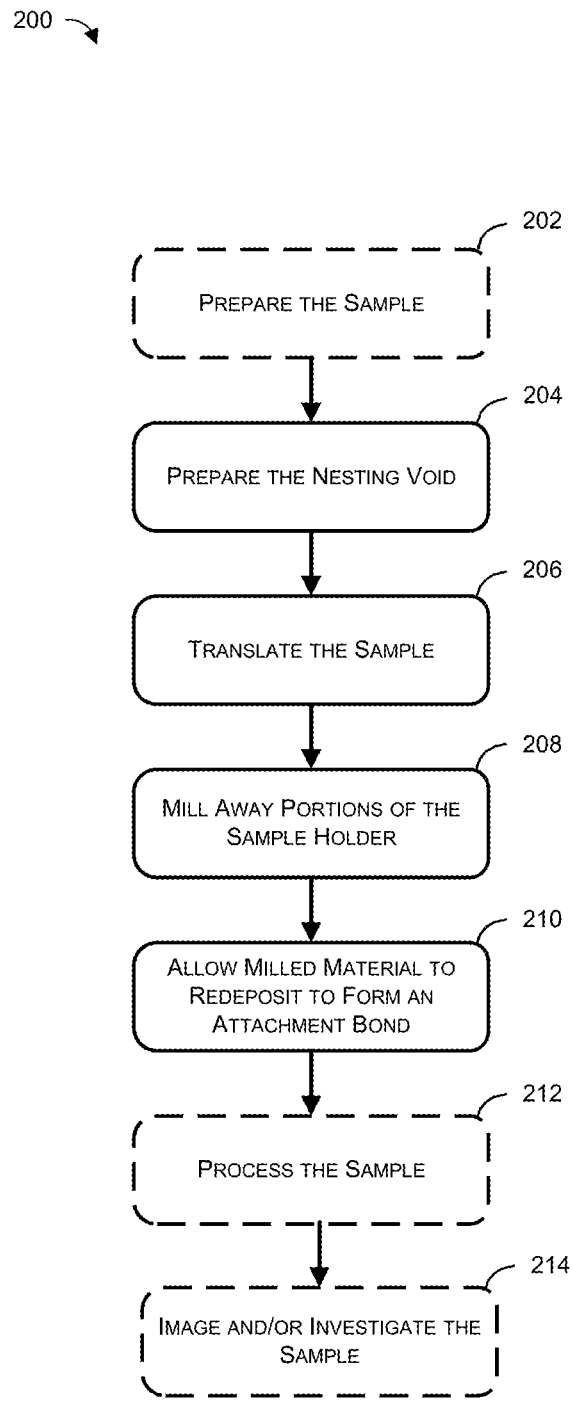
FIG. 2 flow diagram of an illustrative process for performing sample lift-out and protective cap placement for highly reactive materials within charged particle microscopy systems.
Figure 5:
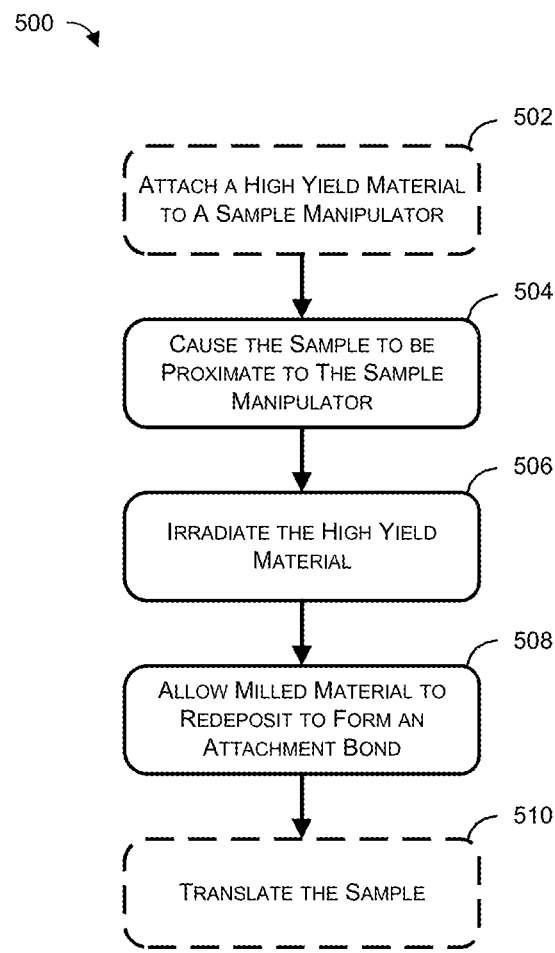
FIG. 5 illustrates a flow diagram of an illustrative process for creating attachments between a sample manipulator and a sample within a charged particle system.

FIGS. 2 and 5 are flow diagrams of illustrative processes shown as a collection of blocks in a logical flow graph, which represent a sequence of operations that can be implemented in hardware, software, or a combination thereof. In the context of software, the blocks represent computer-executable instructions stored on one or more computer-readable storage media that, when executed by one or more processors, perform the recited operations. Generally, computer-executable instructions include routines, programs, objects, components, data structures, and the like that perform particular functions or implement particular abstract data types. The order in which the operations are described is not intended to be construed as a limitation, and any number of the described blocks can be combined in any order and/or in parallel to implement the processes.

Specifically, FIG. 2 is a flow diagram of an illustrative process 200 for performing sample lift-out and protective cap placement for highly reactive materials within charged particle microscopy systems. The process 200 may be implemented in example charged particle microscope setup(s) 100 and/or by the computing architecture 150 described above, or in other environments and architectures.

At 202, the sample is optionally prepared. For example, the sample may be preprocessed to expose a region of interest that is to be imaged and/or investigated. In some embodiments, this may include using a process to form the sample from a larger specimen, such as a sample lift-out procedure where portions of the specimen are milled away to expose a chunk which includes a region of interest, the chunk is attached to a sample manipulator, the chunk is detached from the body of the specimen, and the sample manipulator and/or the specimen is translated so that the chunk moved away from the specimen body. Alternatively, or in addition, a surface of the sample may be milled away and/or polished to expose a region of interest and/or remove damage from the surface to allow for a high-quality image/investigation. In some embodiments, the specimen may correspond to a battery or a portion of a battery, and the sample may be a portion thereof that comprises at least one of lithium, manganese, lithium polymers, lithium cobalt oxides, lithium manganese oxide, lithium manganese cobalt oxides, etc.

At 204, the nesting void is prepared in a support structure. Specifically, the nesting void is prepared in the support structure by removing a volume of material from the support structure to create a volume into which at least a portion of the sample can be housed. For example, a charged particle beam can be used to mill away material from the support structure. The nesting void may correspond to a hole, a pocket, or an inset volume into which a portion of the sample can be inserted. In some embodiments, the support structure may be a sample holder having a beveled edge (e.g., a 45-degree beveled edge), and the nesting void may be a portion of the sample holder near the beveled edge that is milled away with a focused ion beam. Such a nesting void may be milled so that when the sample is inserted in the nesting void, at least a portion of the beveled holder extends beyond the sample.

In various embodiments, the support structure may correspond to one or more of a sample grid, a sample holder, or other structure which allows the sample to be imaged/investigated when the sample is attached to it. The support structure may be at least partially composed of many different materials, including but not limited to, silicon, aluminum, copper, etc. In some embodiments, the support structure is composed of an inert material that is not reactive to the charged particle beam.

At 206, the sample is translated so that at least a portion of the sample is positioned within the nesting void. For example, the sample may be attached to a movable sample manipulator (e.g., a sample probe) which is translated, angled, and/or rotated so that at least a portion of the sample is housed within the nesting void. That is, the sample is positioned such that the portion of the sample is located in a volume where the portion of the support structure that was milled away was located.

At 208, portions of the support structure are milled away. Specifically, portions of the support structure near the portion of the sample and/or which define the nesting void are milled away from the support structure. In some embodiments, an edge/surface of the support structure that defines the nesting void is milled away along a depth of the sample. Alternatively, or in addition, multiple portions of the support structure that partially define the nesting void may be milled away in this manner. For example, a charged particle beam may be used to mill away multiple disparate portions of the support structure that each partially define the nesting void along one or more surfaces of the nesting void. Such multiple disparate portions of the support structure may be milled such that in between the milled portions, projections of the support structure remain proximate to the sample.

At 210, the milled material is allowed to redeposit to form an attachment bond between the sample and the support structure. While the portions of the support structure are milled away at step 208 and immediately afterward, the sample is held in a constant position so that the material which was milled away is allowed to settle on the un-milled portion of the support structure and/or the sample. In this way, the milled material is allowed to form deposits that interconnect to form attachment bonds between the support structure and the sample. In this way, by allowing the milled material to redeposit, one or more attachment bonds may be created between the sample and the un-milled portions of the support structure that hold the sample in place. Not only are these attachment bonds easy for a user to create/easily automated, because these attachment bonds are created without the introduction of a precursor gas or a liquid, this process 200 can be used to attach samples composed of highly reactive materials to the support structure.

At 212, the sample is optionally processed to prepare it for imaging and/investigation. For example, portions of the sample can be milled away with a charged particle beam to expose a region of interest in the sample, polished to remove damage from the surface of the sample, or a combination thereof. In some embodiments, after the exposed surface is imaged/investigated, the sample may be processed one or more additional times so that different regions of interest are exposed for imaging/investigation. In some embodiments, when the sample is milled in step 212, the charged particle beam is angled such that the charged particle beam first mills through a portion of the support structure before it begins removing portions of the sample. In this way, the portion of the support structure is able to be used as a protective cap to prevent curtaining in the exposed sample surface. Thus, in addition to the attachment bonds being created without the introduction of the precursor gas, process 200 may also allow for a protective cap to be utilized without the introduction of the precursor gas. In some embodiments, processing the sample may include milling away an attachment bond between the sample and the sample manipulator such that the sample is disconnected from the sample manipulator. In other embodiments, processing the sample may include milling away a portion of a sample probe such that a tip of the sample probe remains attached to the sample and a remaining portion of the sample probe is disconnected from the sample.

At 214, the sample is imaged and/or investigated. In various embodiments, the imaging and/or investigation of the sample corresponds to performing one or more of serial sectioning tomography on a region of interest on the sample, enhanced insertable backscatter detector (CBS) analysis on the region of interest, and electron backscatter diffraction (EBSD) analysis on the region of interest. Steps 212 and 214 may be iterated so that multiple regions of interest within the sample may be imaged and/or investigated.

Figure 3:
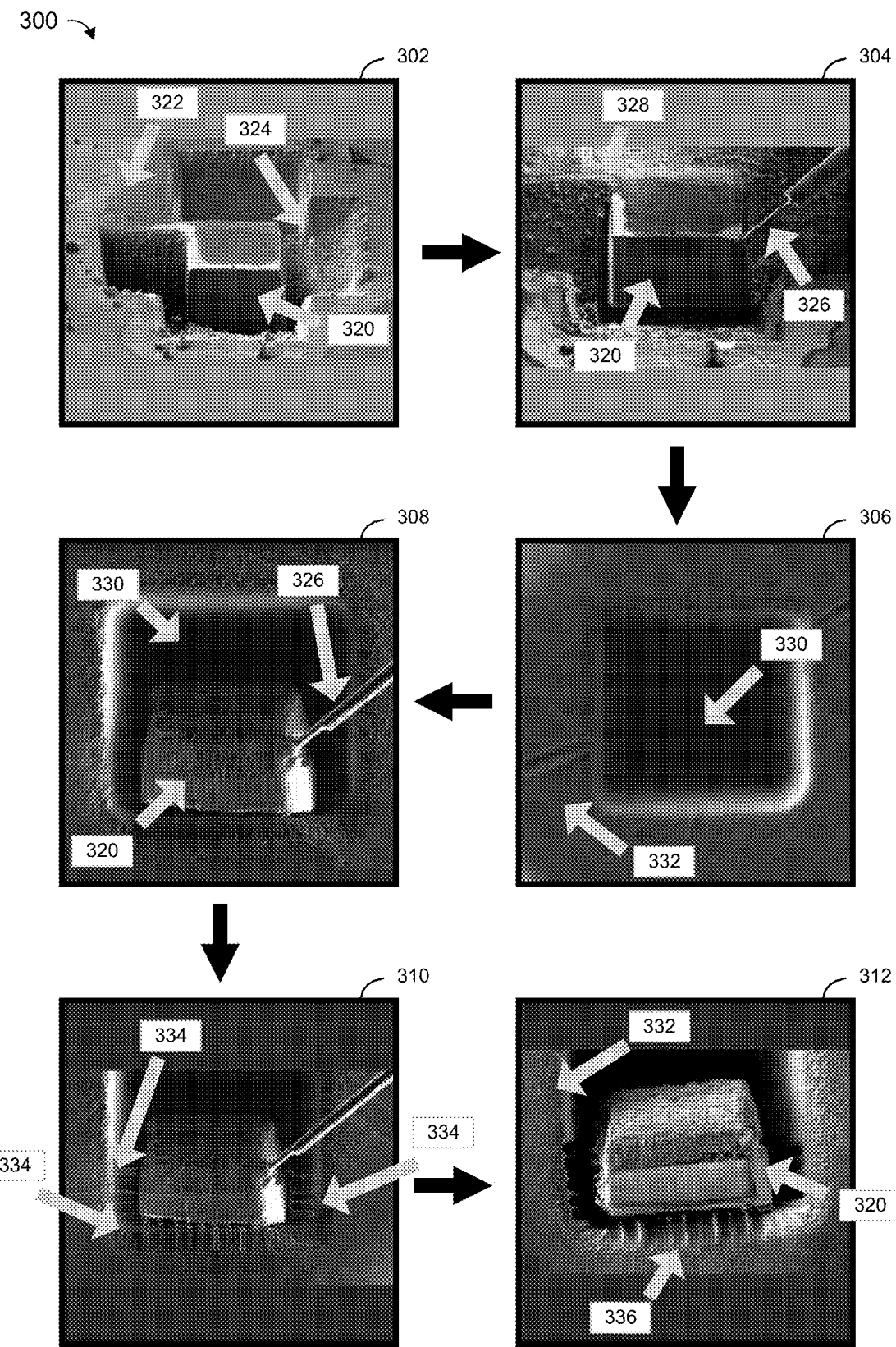
FIG. 3 is a series of captured images that demonstrate an example performance for performing sample lift-out and protective cap placement for highly reactive materials within charged particle microscopy systems.
Figure 7:
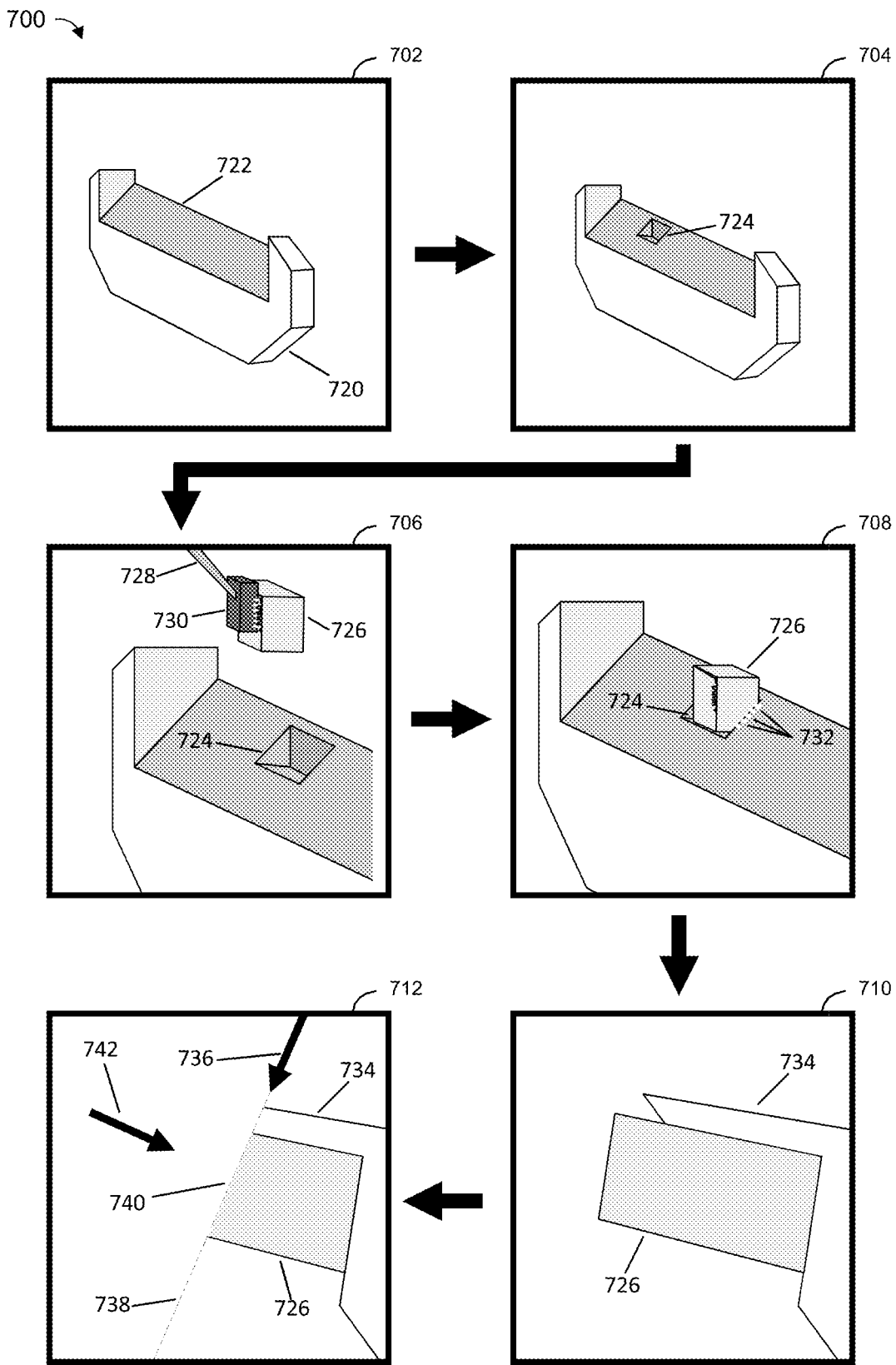
FIG. 7 shows a series of images that demonstrate an example performance of an example process for sample lift-out and protective cap placement for highly reactive materials using a sample holder having a beveled edge.

FIGS. 3 and 7 are visual flow diagrams that illustrate example processes for performing sample lift-out and protective cap placement for highly reactive materials according to the present disclosure. Specifically, FIG. 3 shows a series of captured images 300 that demonstrate an example performance of an example process 200 described in the remarks regarding FIG. 2.

Image 302 shows the optional creation of a sample 320 from a specimen body 322. Specifically, image 302 shows a state where one or more volumes 324 of the specimen body 322 surrounding the sample 320 are milled away using a charged particle beam (e.g., an ion beam). Image 304 shows a subsequent state of the example process where a sample manipulator 326 is attached to the sample 320. For example, the sample 320 may be attached to the sample manipulator 326 using a deposition gas, or by an attachment process described in association with FIG. 5. Once the sample 320 is attached to the sample manipulator 326, the final portions 328 of the specimen that had previously connected the sample to the specimen body are milled away. Once the sample 320 is fully detached from the specimen body in this way, the sample manipulator 326 can translate the sample 320 away from the specimen body 322.

Image 306 shows a state where a nesting void 330 is prepared in a support structure 332. For example, a charged particle beam can be used to mill away material from the support structure 332. The nesting void 330 may correspond to a hole, a pocket, a cavity, or an inset volume into which a portion of the sample can be inserted. While not shown in image 306, the nesting void may in some embodiments correspond to a region next to and/or abutting a raised structure/portion of the support structure such that when a sample is translated into the nesting void a portion of the sample is proximate to and/or abuts the raised structure/portion of the support structure. In various embodiments, the support structure 332 may correspond to one or more of a sample grid, a sample holder, or other structure which allows the sample to be imaged/investigated when the sample is attached to it. The support structure may be at least partially composed of many different materials, including but not limited to silicon, aluminum, copper, etc.

Image 308 shows the state after the sample 320 is translated, tilted, rotated, or otherwise manipulated in relation to the support structure so that at least a portion of the sample is positioned within the nesting void 330. The sample is shown as being be attached to the movable sample manipulator 326 (i.e., a sample probe), which has been translated, angled, and/or rotated so that at least a portion of the sample 320 is housed within the nesting void 330.

Image 310 shows the state of image 308, where a plurality of milling locations 334 have been mapped onto it. Specifically, Image 310 shows a plurality of milling locations 334 that each correspond to a portion of the support structure 332 that is to be milled using a charged particle beam. Image 312 shows a state of the process after the portions 334 of the sample holder 332 have been milled away, and the milled material is allowed to redeposit to form attachment bonds 336 between the sample 320 and the support structure 332.

Figure 4A:
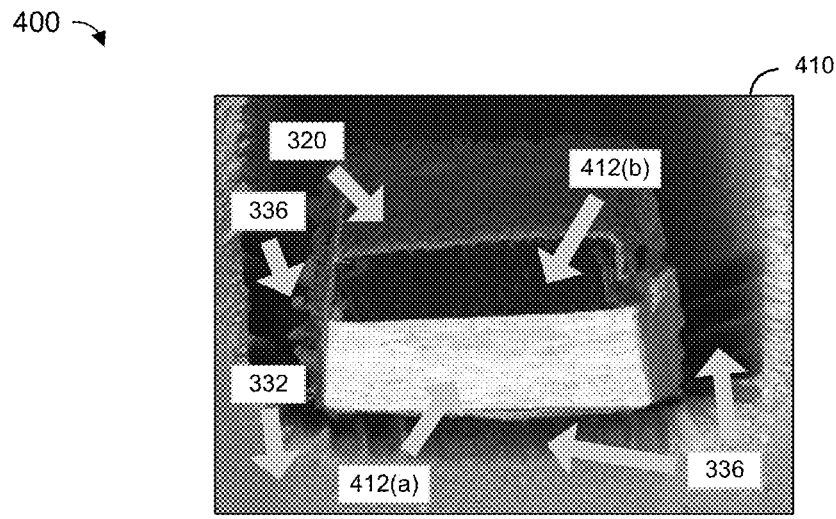
FIGS. 4A-C captured images that show example results of sample lift-out and protective cap placement for highly reactive materials according to the present disclosure.
Figure 4B:
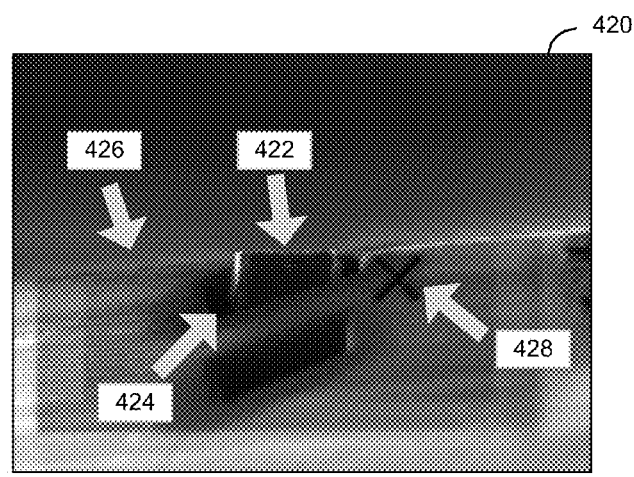
Figure 4C:
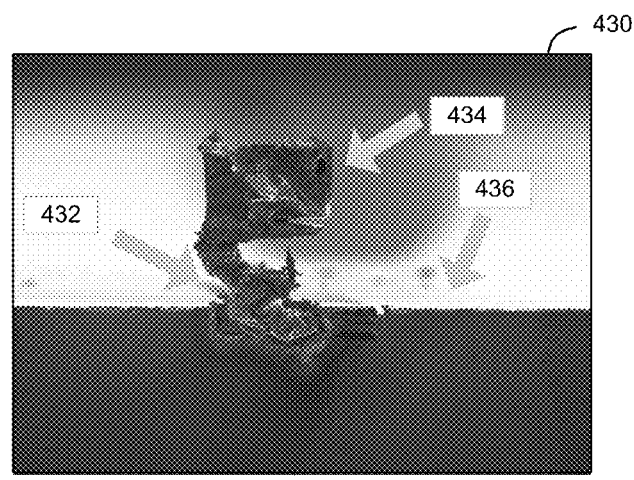

FIGS. 4A-C are captured images that show example results of sample lift-out and protective cap placement for highly reactive materials according to the present disclosure, and according to the prior art. FIG. 4A is an image 410 of sample 320 from FIG. 3 after it has been further processed to prepare it for imaging and/investigation. For example, portions of the sample 320 have be milled away with a charged particle beam to expose a clean surface 412 of a region of interest in the sample, and then polished to remove damage from the surface of the sample. Specifically, FIG. 4A shows an example where the portion of the sample 320 being removed and cleaned such that a clean reactive surface 412(*a*) (i.e., a clean surface of a portion of the sample composed of a reactive material) and a clean stable surface 412(*b*) (i.e., a clean surface of a portion of the sample composed of a non-reactive material) are exposed. In such embodiments where a sample is composed of both a stable and reactive material, milling may be performed through the stable material first such that the stable material acts as a cap that reduces curtaining in the clean reactive surface 412(*a*). Alternatively, in some embodiments the milling may be performed such that portions of the support structure 322 are first milled through such that the support structure 322 acts as a cap that reduces curtaining in the clean reactive surface 412(*a*). Using the processes described herein, high-quality EBSD maps and/or band contrast maps may be obtained for clean surfaces 412 of highly reactive materials, which were previously not possible with prior techniques.

Additionally, the processes described herein in some embodiments have been shown to preserve the crystallinity of highly reactive materials as evidenced by acquired Kikuchi patterns of portions of such clean surfaces 408. FIG. 4B shows an image 420 where a sample 422 has been inserted into a nesting void 424 in a support structure 426 and attached using techniques according to the present disclosure. FIG. 4B further shows the use of 428 for aid in user processing and/or automated processing and investigation of regions of interest in the sample 422.

FIG. 4C shows the results of a sample lift-out and protective cap placement for a highly reactive material using prior art techniques. As can be seen, when an attachment 432 was formed between the highly reactive sample 434 and the support structure 436, the sample 434 underwent massive damage. This damage occurs at two separate steps of prior art systems. Firstly, the sample 434 may be damaged by a reaction with an outside material that is introduced to form the attachment (e.g., deposition gas, bonding liquid). Secondly, even if the damage in such an introduction of outside material is not catastrophic, the reactions between the outside material and the highly reactive material 434 can cause the surface of the sample 434 to have subsequent catastrophic reactions when irradiated with a charged particle beam. As shown in image 430, because of these reactions, the prior art techniques for in situ attachment of samples do not work for highly reactive materials.

FIG. 5 is a flow diagram of an illustrative process 500 for creating attachments between a sample manipulator and a sample within a charged particle system. The process 500 may be implemented in example processes 200-400, example charged particle microscope setup(s) 100, and/or by the computing architecture 150 described above, or in other environments and architectures.

At 502, a high sputter yield material is optionally attached to a sample manipulator. Specifically, a high sputter yield material, such as copper, may be attached to a sample manipulator within the chamber of a charged particle system, outside of such a chamber, or a combination thereof. For example, the high sputter yield material may be attached to a probe portion of a sample manipulator using gas deposition attachment where a precursor gas is introduced to a region between the sample manipulator and the high sputter yield material, and then a charged particle beam is used to induce the precursor gas to deposit to form an attachment bond. In another example process, the sample manipulator may be moved into immediate proximity with the high sputter yield material, a charged particle beam may be used to mill away portions of the high sputter yield material proximate to the sample, and the milled material may be allowed to settle to form one or more attachment bonds between the sample manipulator and the high sputter yield material.

Alternatively, in some embodiments of the present process, instead of needing to perform step 502, the sample manipulator comprises a probe that is composed of the high sputter yield material (e.g., purchased with such a coating, or purchased without where the coating was added via deposition in situ or ex situ).

At 504, a sample is caused to be proximate to the sample manipulator. Specifically, the sample and/or the sample manipulator may be moved such that a portion of the sample manipulator that is to be attached to the sample (e.g., a probe, an intermediate body made of high sputter yield material attached in step 502, etc.) are within 10 microns of each other, within 1 micron of each other, or closer. For example, the sample and/or the sample manipulator may be attached to a movement component and/or otherwise configured to be translated, angled, and/or rotated.

At 506 the high sputter yield material is irradiated with a charged particle beam. Specifically, a charged particle beam is used to mill away one or more portions of the high sputter yield material while leaving one or more other portions of the high sputter yield material located close to the sample manipulator remaining unmilled. In this way, while some portions of the high sputter yield material near the sample are removed, there remain portions of the material that are still within 10 microns, 1 micron, or closer to the sample. For example, three portions located on an edge/surface of the high sputter yield material may be milled, while two portions of the material located between the three portions may remain un-milled.

At 508, the milled high sputter yield material is allowed to redeposit to form an attachment bond between the sample and the sample manipulator. While the portions of the high sputter yield material are milled away at step 506 and immediately afterward the sample is held in a constant position so that the material which was milled away is allowed to settle on the un-milled portion of the high sputter yield material and/or the sample. In this way, the milled material is allowed to form deposits that interconnect to form attachment bonds between the high sputter yield material and the sample. By allowing the milled material to redeposit, one or more attachment bonds may be created between the sample and the un-milled portions of the high sputter yield material that hold the sample in place. Not only are these attachment bonds easy for a user to create/easily automated, because these attachment bonds are created without the introduction of a precursor gas or a liquid, this process 500 can be used to attach samples made of highly reactive materials to the support structure. Moreover, this process 500 allows for attachment bonds to be performed at cryogenic temperatures and/or in a vacuum without requiring specialized microscope mechanisms to be developed or included a charged particle system, and without users needing to learn complex processes.

At 510, the sample is optionally translated by the sample manipulator. For example, the sample manipulator may translate, angle, and/or rotate the sample so that the sample is in a desired position within the charged particle system.

Figure 6A:
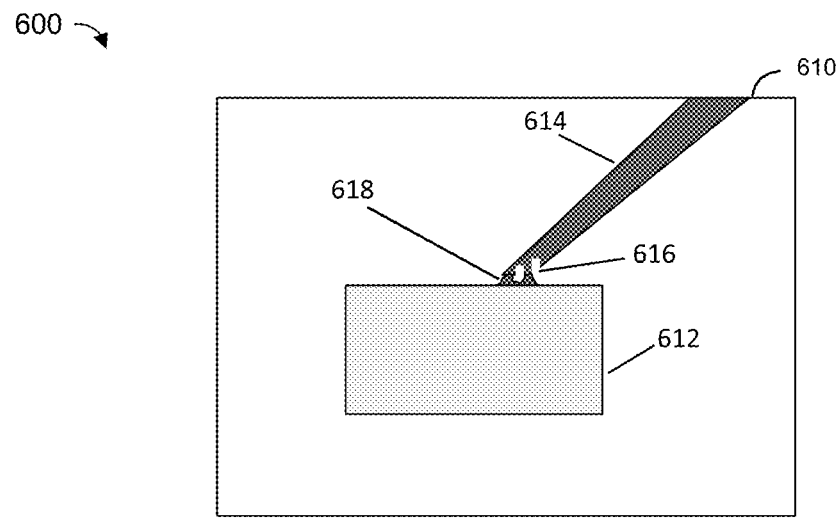
FIGS. 6A-C show example embodiments for creating attachments between a sample manipulator and a sample within a charged particle system.
Figure 6B:
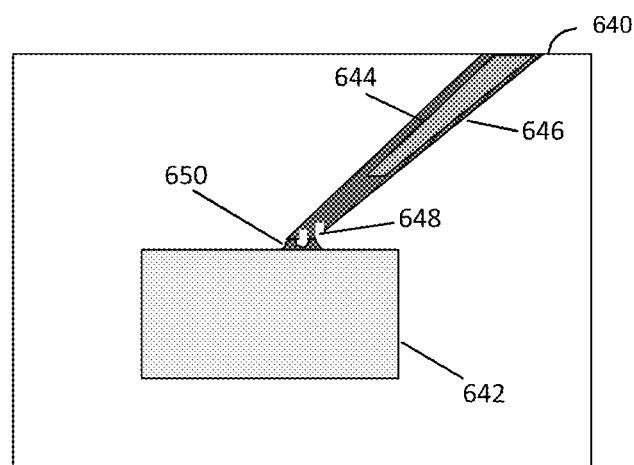
Figure 6C:
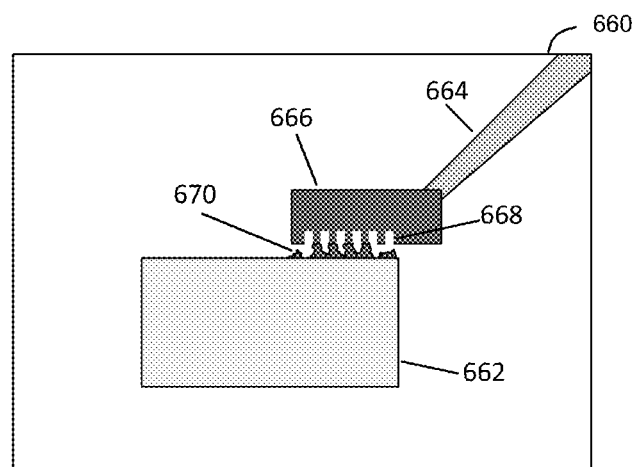

FIGS. 6A-C show different example embodiments for creating attachments between a sample manipulator and a sample within a charged particle system. For example, FIG. 6A depicts an example 610 where the sample 612 is attached to a sample manipulator 614 that corresponds to a sample probe made of a high sputter yield material. In this way, when portions 616 of the sample probe proximate the sample 612 are milled away, the milled material at least partially redeposits to form attachment structures 618 between the sample 612 and the sample manipulator 614.

FIG. 6B depicts an example 640 where a sample 642 is attached to a sample manipulator that corresponds to a sample probe 644 that is coated with a high sputter yield material 646. In this way, when portions 648 of the coating proximate the sample 642 are milled away, the milled material at least partially redeposits to form attachment structures 650 between the sample 642 and the sample manipulator. FIG. 6C depicts an example 660 where a sample 662 is attached to a sample manipulator that corresponds to a sample probe 664 that is attached to an intermediary body 666 composed of a high sputter yield material. When portions 668 of the intermediary body 666 proximate the sample 642 are milled away, at least some of the milled material redeposits to form attachment structures 670 between the sample 662 and the intermediary body 666.

FIG. 7 shows a series of images 700 that demonstrate an example performance of an example process for sample lift-out and protective cap placement for highly reactive materials using a sample holder having a beveled edge. Image 702 shows an example sample holder 720 that has a beveled edge 722. According to the present invention, the beveled edge may be any angle less than 90-degrees. In some embodiments, a charged particle beam may be used to mill away portions of the sample holder 720 to create the beveled edge 722. Image 704 shows a state where a nesting void 724 is prepared in a support structure 720 proximate to the beveled edge 722. For example, a charged particle beam can be used to mill away material from the support structure 720 such that a hole, a pocket, or an inset volume is created into which a portion of a sample can be inserted.

Image 706 shows a sample 726 in the process of being translated with a sample manipulator 728 such that at least a portion of the sample 726 is positioned within the nesting void 724. Specifically, image 706 shows an embodiment where the sample 726 has been attached to the sample manipulator 728 using an intermediate body 730 made of high sputter yield material, as shown and described in association with FIGS. 5 and 6C. Image 708 shows the state after the sample 726 has been translated so that at least a portion is positioned within the nesting void 724, and then the sample 726 is attached to the sample holder 720 by milling away portions of the sample holder 732 proximate to the sample such that milled material redeposits forming attachment structures between the sample 726 and the sample holder 720.

Image 710 shows a cross-section of the state depicted in image 708. Image 710 shows a cross-section of the sample 726 and a thin portion of sample holder 734 that extends along a surface of the sample 726. Image 712 shows a state where a charged particle beam 736 is used to mill away portions of the sample 726 and the thin portion of the sample holder 734 along a plane 738 to expose a surface of interest 740. In this way, the thin portion of the sample holder 734 acts as a protective cap through which the charged particle beam 736 is first incident upon, thus reducing curtaining effects on the region of interest 740. In some embodiments, the region of interest 740 may then be optionally imaged or otherwise investigated using an electron beam 742.

Examples of inventive subject matter according to the present disclosure are described in the following enumerated paragraphs.

A1. A method for performing sample lift-out and protective cap placement for highly reactive materials within charged particle microscopy systems, the method comprising: preparing a nesting void in a support structure; translating at least a portion of a sample into the nesting void; and milling material from a region of the support structure that defines the nesting void such that at least some of the material milled from the support structure redeposits to form an attachment bond between the sample and a remaining portion of the support structure.

A2. The method of paragraph A1, wherein preparing the nesting void comprises milling away a volume of the support structure, wherein the volume is able to receive the at least the portion of the sample.

A2.1. The method of paragraph A2, wherein the nesting void is a hole, and wherein translating the at least the portion of the sample into the nesting void corresponds to translating the sample such that the at least the portion of the sample is inside the hole.

A2.2. The method of any of paragraphs A2-A2.1, wherein the nesting void is configured such that, when the attachment bond is formed between the sample and the support structure, the at least the portion of the sample is positioned at a location where the volume of the sample that is milled away was located.

A2.3. The method of any of paragraphs A2-A2.2, wherein the volume of the support structure is milled away with a focused ion beam A3. The method of any of paragraphs A1-A2.3, wherein the method further comprises performing or more of: serial sectioning tomography on the sample; enhanced insertable backscatter detector (CBS) analysis on the sample; chemical analysis, SIMS analysis, Ebeam (EDX) analysis, Raman analysis, and electron backscatter diffraction (EBSD) analysis on the sample.

A3.1. The method of paragraph A3, wherein the method comprises milling away a portion of the sample to expose a surface of interest, and imaging at least a portion of the surface of interest.

A3.1.1. The method of paragraph A3.1, wherein milling is performed with a focused ion beam.

A3.1.2. The method of any of paragraphs A3.1-A3.1.1, wherein at least a portion of the support structure is used as a protective cap during the milling of the sample.

A3.1.2.1. The method of paragraph A3.1.2, wherein using the portion of the support structure as a protective cap comprises milling positioning the focused ion beam such that the portion of the support structure is milled away before the portion of the sample is milled away by the focused ion beam.

A3.1.2.1.1. The method of paragraph A3.1.2.1, wherein the portion of the sample is milled away using a high current mill with a FIB or plasma FIB.

A3.1.2.2. The method of any of paragraphs A3.1.2-A3.1.2.1.1, wherein using the portion of the support structure as a protective cap prevents a tail of the focused ion beam from milling away portions of the sample.

A3.1.3. The method of any of paragraphs A3.1-A3.1.2.2, wherein the imaging comprises irradiating the at least apportion of the surface of interest with an electron beam.

A3.1.4. The method of any of paragraphs A3.1-A3.1.3, wherein the process further comprises milling away an additional portion of the sample to expose additional surface of interest.

A3.1.5. The method of any of paragraphs A3.1-A3.1.4, wherein the process further comprises milling away a plurality of additional portions of the sample to expose a plurality of additional surfaces of interest.

A3.1.6. The method of any of paragraphs A3.1-A3.1.5, wherein milling away the portion of the sample is performed at least in part using a rocking mill.

A4. The method of any of paragraphs A1-A3.1.6, wherein the support structure is a sample grid.

A4.1. The method of paragraph A4, wherein the sample grid is a TEM specimen grid.

A5. The method of any of paragraphs A1-A3.1.6, wherein the support structure is a sample holder.

A6. The method of any of paragraphs A1-A3.1.6, wherein the support structure is at least partially composed of silicon.

A7. The method of any of paragraphs A1-A3.1.6, wherein the support structure is an aluminum block.

A8. The method of any of paragraphs A1-A3.1.6, wherein the support structure is composed of an inert material that is not reactive to a(the) focused ion beam.

A9. The method of any of paragraphs A1-A3.1.6, wherein the support structure is a beveled holder having a beveled edge.

A9.1. The method of paragraph A9, wherein when the sample is inserted in the nesting void, at least a portion of the beveled holder extends beyond the sample.

A9.2. The method of any of paragraphs A9-A9.1, further comprising milling away a/the section of the sample comprises milling through the beveled edge using the beveled edge as a protective cap.

A9.3. The method of any of paragraphs A9-A9.2, wherein the beveled edge is milled at a 45-degree angle.

A9.4. The method of any of paragraphs A9-A9.3, wherein You could create the beveled edge, or it could be a commercially purchased piece.

A10. The method of any of paragraphs A1-A9.4, wherein the sample is attached to a sample probe via an attachment bond, and where in translating at least the portion of the sample into the nesting void comprises translating the sample probe such that the at least the portion of the sample is translated into the nesting void A10.1. The method of paragraph A10, further comprising milling away the attachment bond such that the sample is disconnected from the sample probe.

A10.2. The method of paragraph A10, further comprising milling away a portion of the sample probe such that a tip of the sample probe remains attached to the sample and a remaining portion of the sample probe is disconnected from the sample.

A11. The method of any of paragraphs A1-A10.2, further comprising the steps of preparing the sample from a specimen.

A11.1. The method of paragraph A11, wherein preparing the sample from the specimen comprises the steps of: milling away portions of the specimen surrounding a region of interest; attaching a sample probe to the region of interest; and milling away a portion of the specimen such that the region of interest is no longer attached to the specimen.

A11.1.1. The method of paragraph A11.1, wherein preparing the sample from the specimen further comprises translating the sample probe such that the region of interest is away from the specimen.

A11.1.2. The method of any of paragraphs A11.1-A11.1.1, wherein the region of interest corresponds to the sample.

A11.1.3. The method of any of paragraphs A11.1-A11.1.2, wherein attaching the sample probe to the region of interest comprises the method of any of paragraphs B1-B14.2.2.2.2.1.

A12. The method of any of paragraphs A1-A11.1.3, wherein the specimen corresponds to a battery or a portion of a battery.

A12.1. The method of paragraph A12, wherein the specimen corresponds to a lithium battery, a lithium ion battery, a battery anode, a battery cathode, a battery separator, or a combination thereof.

A13. The method of any of paragraphs A1-A12.1, wherein the material comprises at least one of lithium, magnesium, lithium polymers, lithium manganese oxide, lithium cobalt oxide, and lithium sulfides.

A14. The method of any of paragraphs A1-A13, wherein the milling is performed with one of a focused ion beam and an electron beam.

A14.1. The method of paragraph A14, wherein the ion beam is a plasma focused ion beam.

B1. A method for creating attachments between a sample manipulator and a sample within a charged particle systems, the method comprising: translating a sample manipulator so that it is proximate to a sample, wherein the portion of the sample manipulator proximate to the sample is composed of a high sputter yield material; and milling, with a charged particle beam, the high sputter yield material such that portions of the high sputter yield material is removed from the sample manipulator, and wherein at least some of the removed high sputter yield material redeposits to form an attachment between the sample manipulator and the sample.

B1.1. The method of paragraphs B1, wherein the high sputter yield material corresponds to a material that yields a greater number of atoms per ion when irradiated with a specific ion species and voltage than silicon or tungsten.

B1.1.1. The method of paragraph B1.1, wherein the high sputter yield material corresponds to rate of emission of greater than 5, 7, 8, or 10 atoms per ion when the material is irradiated with a 30 kV focused ion beam.

B1.1.1.1. The method of paragraphs B1.1.1, wherein the 30 kV focused ion beam is one of a Ga+, Xe+, Ar, N+, Cs+, Bi+, or O+ focused ion beam.

B1.2. The method of any of paragraphs B1-B1.1.1.1, wherein the high sputter yield material is copper or brass.

B2. The method of any of paragraphs B1-B1.2, wherein the translating the sample manipulator comprises translating the sample manipulator such that the portion composed of the high sputter yield material is within 10 microns.

B2.1. The method of paragraphs B2, wherein the translating the sample manipulator comprises translating the sample manipulator such that the portion composed of the high sputter yield material is within one micron.

B3. The method of any of paragraphs B1-B2.1, wherein the sample manipulator comprises a probe that is composed of the high sputter yield material.

B4. The method of any of paragraphs B1-B2.1, wherein the sample manipulator comprises a probe that is coated with the high sputter yield material.

B4.1. The method of paragraphs B4, wherein irradiating the high sputter yield material comprises milling away portions of the coating proximate to the sample.

B5. The method of any of paragraphs B1-B2.1, wherein the sample manipulator comprises an intermediate body attached to a probe, and wherein the intermediate body is composed of the high sputter yield material.

B5.1. The method of paragraphs B5, wherein the intermediate body is attached to a probe portion of the sample manipulator.

B5.1.1. The method of paragraphs B5.1, wherein the intermediate body is attached to the probe portion of the sample manipulator via gas deposition.

B5.1.2. The method of paragraphs B5.1, wherein the intermediate body is attached to the probe portion of the sample manipulator by a process comprising:
translating the probe portion so that it is proximate to the intermediate body; and
milling, with the charged particle beam, portions of the intermediate body proximate to the probe, and wherein at least some of the removed intermediate body redeposits to form an attachment between the probe portion and the intermediate body.

B6. The method of any of paragraphs B1-B5.1.2, wherein the charged particle beam is a focused ion beam.

B6.1. The method of paragraphs B6, wherein the charged particle beam is a plasma focused ion beam.

B7. The method of any of paragraphs B1-B5.1.2, wherein the charged particle beam is an electron beam B8. The method of any of paragraphs B1-B7, wherein the method for creating attachments between the sample manipulator and the sample within the charged particle systems requires a reduced amount of precursor gas over traditional attachment methods.

B9. The method of any of paragraphs B1-B8, wherein the attachment between the sample manipulator and sample is formed without additional precursor gas being added to the system.

B10. The method of any of paragraphs B8 or B9, wherein the precursor gas comprises platinum.

B11. The method of any of paragraphs B1-B10, wherein the method is performed in the charged particle system at cryo temperatures.

B12. The method of any of paragraphs B1-B11, wherein the method is performed in the charged particle system at vacuum.

B13. The method of any of paragraphs B1-B12, wherein the sample is a lamella.

B14. The method of any of paragraphs B1-B13, wherein milling the high sputter yield material comprises milling multiple locations on the high sputter yield material proximate to the sample.

B14.1. The method of paragraphs B14, wherein each of the multiple locations are located at an edge of the high sputter yield material proximate to the sample.

B14.2. The method of any of paragraphs B14-B14.1, wherein between the multiple locations is at least one region of the high sputter yield material along the edge proximate to the sample that is not milled away.

B14.2.1. The method of paragraphs B14.2, wherein the at least some of the removed high sputter yield material redeposits to form the attachment between the sample and the at least one region of the high sputter yield material along the edge proximate to the sample that is not milled away.

B14.2.2. The method of any of paragraphs B14.2-B14.2.1, wherein there are multiple regions of the high sputter yield material that are not milled away along the edge of the sample proximate to the sample B14.2.2.1. The method of paragraphs B14.2.2, wherein the at least some of the removed high sputter yield material redeposits to form the attachment between the sample and multiple of the at least one region of the high sputter yield material along the edge proximate to the sample that is not milled away.

B14.2.2.2. The method of any of paragraphs B14.2.2-B14.2.2.1, wherein the at least some of the removed high sputter yield material redeposits to form a plurality of attachments between the sample and the high sputter yield material.

B14.2.2.2.1. The method of paragraph B14.2.2.2, wherein each of the plurality of attachments connects the sample to a corresponding one of the at least one region of the high sputter yield material along the edge proximate to the sample that is not milled away.

B14.2.2.2.2. The method of any of paragraphs B14.2.2.2-B14.2.2.2.1, wherein multiple of the at least one region of the high sputter yield material along the edge proximate to the sample that is not milled away.

B14.2.2.2.2.1. The method of paragraph B14.2.2.2.2, wherein at least four attachments are formed between the sample and corresponding regions of the high sputter yield material along the edge proximate to the sample that are not milled away.

C1. A charged particle system, the system comprising: a charged particle emitter configured to emit charged particles towards a sample; a sample holder configured to support the sample; an optical column configured to direct the charged particles to be incident on the sample; a detector system configured to detect emissions from the sample due to irradiation by the charged particles; one or more processors; and a memory storing non-transitory computer readable instructions that, when executed by the one or more processors, cause the one or more processors to perform the method of any of paragraphs A1-A14.1 and/or B1-B14.2.2.2.2.1.

C2. The charged particle system of paragraph C1, further comprising a vacuum chamber that contains the sample.

C2.1. The charged particle system of paragraph C2, wherein the instructions cause the one or more processors to perform the method of any of paragraphs A1-A14.1 and/or B1-B14.2.2.2.2.1 while the sample is at vacuum.

C2.2. The charged particle system of paragraph C2, wherein the instructions cause the one or more processors to perform the method of any of paragraphs A1-A14.1 and/or B1-B14.2.2.2.2.1 without breaking the vacuum in the vacuum chamber.

C3. The charged particle system of any of paragraphs C1-C2.2, wherein the instructions cause the one or more processors to perform the method of any of paragraphs A1-A14.1 and/or B1-B14.2.2.2.2.1 while the sample is at cryo temperatures.

D1. Use of the system of any of paragraphs C1-C3 to perform the method of any of paragraphs A1-A14.1 and/or B1-B14.2.2.2.2.1.

E1. A non-transitory computer readable media that stores instructions that, when executed by a processor, causes the processor to initiate the performance of the method of any of paragraphs A1-A14.1 and/or B1-B14.2.2.2.2.1.

F1. Use of the non-transitory computer readable media of paragraph E1 to perform the method of any of paragraphs A1-A12.7 and/or B1-B14.2.2.2.2.1.

What is claimed is:

1. A method for performing sample lift-out and protective cap placement within charged particle microscopy systems, the method comprising:
   preparing a nesting void in a support structure, wherein preparing the nesting void comprises milling away a volume of the support structure;
   translating at least a portion of a sample into the nesting void; and
   milling material from a region of the support structure that defines the nesting void such that at least some of the material milled from the support structure redeposits to form an attachment bond between the sample and a remaining portion of the support structure.

2. The method of claim 1, wherein translating the at least the portion of the sample into the nesting void corresponds to translating the sample such that the at least the portion of the sample is inside the volume.

3. The method of claim 2, wherein the nesting void is configured such that, when the attachment bond is formed between the sample and the support structure, the at least the portion of the sample is positioned at a location where the volume of the sample that is milled away was located.

4. The method of claim 1, wherein the method further comprises the steps of:
   milling away a portion of the sample to expose a surface of interest; and
   imaging at least a portion of the surface of interest.

5. The method of claim 4, wherein at least a portion of the support structure is used as a protective cap during the milling of the sample.

6. The method of claim 5, wherein using the portion of the support structure as a protective cap comprises positioning a focused ion beam such that the portion of the support structure is milled away before the portion of the sample is milled away by the focused ion beam.

7. The method of claim 1, wherein the support structure is one of a sample grid, a sample holder, and an aluminum block.

8. The method of claim 7, wherein the support structure is composed of an inert material that is not chemically reactive to a focused ion beam.

9. The method of claim 1, wherein the support structure is a beveled holder having a beveled edge, and where the nesting void is prepared proximate to the beveled edge.

10. The method of claim 9, wherein when the sample is inserted in the nesting void, at least a portion of the beveled holder extends beyond the sample.

11. The method of claim 9, further comprising using the beveled edge as a protective cap by milling away a section of the sample by first milling through the beveled holder.

12. The method of claim 1, wherein the sample is attached to a sample probe via an attachment bond, and where in translating at least the portion of the sample into the nesting void comprises translating the sample probe such that the at least the portion of the sample is translated into the nesting void.

13. The method of claim 12, wherein attaching the sample probe to the sample comprises the steps of:
translating the sample probe so that it is proximate to the sample, wherein a portion of the sample probe proximate to the sample is composed of a high sputter yield material; and
milling, with a charged particle beam, the high sputter yield material such that portions of the high sputter yield material is removed from the sample probe, and wherein at least some of the removed high sputter yield material redeposits to form an attachment between the sample probe and the sample.

14. The method of claim 13, wherein the sample probe comprises one of:
a probe that is composed of the high sputter yield material;
a probe that is coated with the high sputter yield material; and
an intermediate body attached to a probe.

15. The method of claim 1, wherein the sample corresponds to a battery, battery raw materials, or a portion of a battery.

16. A charged particle system, the system comprising:
a charged particle emitter configured to emit charged particles towards a sample;
a sample holder configured to support the sample; an optical column configured to direct the charged particles to be incident on the sample;
a detector system configured to detect emissions from the sample due to irradiation by the charged particles;
one or more processors; and
a memory storing non-transitory computer readable instructions that, when executed by the one or more processors, cause the one or more processors to perform the steps of:
preparing a nesting void in a support structure, wherein preparing the nesting void comprises milling away a volume of the support structure;
translating at least a portion of a sample into the nesting void; and
milling material from a region of the support structure that defines the nesting void such that at least some of the material milled from the support structure redeposits to form an attachment bond between the sample and a remaining portion of the support structure.

17. The charged particle system claim 16, wherein the nesting void is configured such that, when the attachment bond is formed between the sample and the support structure, the at least the portion of the sample is positioned at a location where the volume of the sample that is milled away was located.

18. The charged particle system claim 16, further comprising a vacuum chamber that contains the sample, and wherein the instructions cause the one or more processors to perform the steps while the sample is at state of vacuum.

19. The charged particle system of claim 16, wherein the instructions cause the one or more processors to perform the steps while the sample is at cryo-temperatures.

20. A non-transitory computer readable media that stores instructions that, when executed by a processor, causes the processor to initiate the performance of the steps:
preparing a nesting void in a support structure, wherein preparing the nesting void comprises milling away a volume of the support structure;
translating at least a portion of a sample into the nesting void; and
milling material from a region of the support structure that defines the nesting void such that at least some of the material milled from the support structure redeposits to form an attachment bond between the sample and a remaining portion of the support structure.

* * * * *

UNITED STATES PATENT AND TRADEMARK OFFICE
CERTIFICATE OF CORRECTION

| | | |
|---|---|---|
| PATENT NO. | : 12,165,832 B2 | Page 1 of 1 |
| APPLICATION NO. | : 17/566894 | |
| DATED | : December 10, 2024 | |
| INVENTOR(S) | : Adam Stokes et al. | |

It is certified that error appears in the above-identified patent and that said Letters Patent is hereby corrected as shown below:

On the Title Page

In Column 1, item (72) under Inventors, Line 3, delete "Hiilsboro," and insert -- Hillsboro, --, therefor.

In the Claims

In Column 22, Claim 17, Line 15, delete "system claim" and insert -- system of claim --, therefor.

In Column 22, Claim 18, Line 21, delete "system claim" and insert -- system of claim --, therefor.

Signed and Sealed this
Fourth Day of March, 2025

Coke Morgan Stewart
*Acting Director of the United States Patent and Trademark Office*